(12) United States Patent
Connolly (10) Patent No.: US 12,206,973 B2
(45) Date of Patent: Jan. 21, 2025

(54) CAMERA FOR A MOTOR VEHICLE WITH A HOUSING AND AN ELECTRICALLY CONDUCTIVE CIRCUIT BOARD CARRIER SEPARATE THERETO AS WELL AS METHOD

(71) Applicant: Connaught Electronics Ltd., Tuam (IE)

(72) Inventor: Eanna Connolly, Tuam (IE)

( * ) Notice: Subject to any disclaimer, the term of this patent is extended or adjusted under 35 U.S.C. 154(b) by 239 days.

(21) Appl. No.: 17/797,512

(22) PCT Filed: Jan. 25, 2021

(86) PCT No.: PCT/EP2021/051551
§ 371 (c)(1),
(2) Date: Aug. 4, 2022

(87) PCT Pub. No.: WO2021/156080
PCT Pub. Date: Aug. 12, 2021

(65) Prior Publication Data
US 2023/0109282 A1  Apr. 6, 2023

(30) Foreign Application Priority Data
Feb. 4, 2020  (DE) ............... 10 2020 102 694.3

(51) Int. Cl.
*H04N 23/57* (2023.01)
*B60R 11/04* (2006.01)
(Continued)

(52) U.S. Cl.
CPC ............. *H04N 23/57* (2023.01); *B60R 11/04* (2013.01); *G02B 7/02* (2013.01); *H04N 23/51* (2023.01); *H04N 23/55* (2023.01); *H05K 1/0215* (2013.01)

(58) Field of Classification Search
CPC ......... H04N 23/57; H04N 23/51; B60R 11/04
See application file for complete search history.

(56) References Cited

U.S. PATENT DOCUMENTS

2010/0097519 A1  4/2010  Byrne et al.
2017/0223243 A1*  8/2017  Nakamura ............. G02B 7/023
(Continued)

FOREIGN PATENT DOCUMENTS

DE  10342526 A1  4/2005

OTHER PUBLICATIONS

International Search Report and Written Opinion in corresponding International Application No. PCT/EP2021/051551, mailed May 31, 2021 (17 pages).
(Continued)

*Primary Examiner* — Nicholas G Giles
(74) *Attorney, Agent, or Firm* — Osha Bergman Watanabe & Burton LLP (57) ABSTRACT

An aspect of the invention relates to a camera (4) for a motor vehicle (1), with a housing (9), which is formed of an electrically conductive material, with at least one circuit board (47), which is arranged in the housing (9), wherein the camera (4) comprises an electrically conductive circuit board carrier (24) separate to the housing (9), which carries the circuit board (47) and is connected to the circuit board (47) in electrically conductive manner, wherein the circuit board carrier (47) is arranged in the housing (9) and is connected to the housing (9) in electrically conductive manner. A further aspect relates to a method for mounting a camera (4).

12 Claims, 10 Drawing Sheets

(51) Int. Cl.
*G02B 7/02* (2021.01)
*H04N 23/51* (2023.01)
*H04N 23/55* (2023.01)
*H05K 1/02* (2006.01)

(56) References Cited

U.S. PATENT DOCUMENTS

| | | |
|---|---|---|
| 2017/0272624 A1 | 9/2017 | Minikey, Jr. et al. |
| 2018/0013935 A1 | 1/2018 | Kunze et al. |
| 2019/0222726 A1 | 7/2019 | Pan et al. |
| 2021/0122299 A1* | 4/2021 | Garcia .................. G03B 30/00 |

OTHER PUBLICATIONS

German Search Report in corresponding German Application No. 10 2020 102 694.3, dated Oct. 5, 2020 (5 pages).

* cited by examiner

CAMERA FOR A MOTOR VEHICLE WITH A HOUSING AND AN ELECTRICALLY CONDUCTIVE CIRCUIT BOARD CARRIER SEPARATE THERETO AS WELL AS METHOD

An aspect of the invention relates to a camera for a motor vehicle. The camera comprises a housing. The housing is formed of an electrically conductive material. Moreover, the camera comprises at least one circuit board arranged in the housing. A further aspect of the invention relates to a method for assembling a camera.

Such configurations of cameras are known from the prior art. Thus, US 2010/0097519 A1 for example shows a corresponding camera. There, a circuit board is directly screwed to a housing front part by screw connections. By such configurations, corresponding space requirement is needed in the direction of the longitudinal axis of the camera. Because, the front part has to be configured as long as a corresponding screw receptacle for a screw is allowed on the one hand. Moreover, screws are usually correspondingly long in this respect and also need corresponding space requirement. Therefore, such an attachment of a circuit board directly to a housing front part by a screw connection is disadvantageous in this respect.

Moreover, configurations are known, in which a circuit board is directly attached to the housing part of the housing of the camera by a solder joint. Since the housing of the camera is usually of metal, in particular aluminum, such weld joints are expensively and difficultly to produce. Therefore, directly soldering a circuit board to an inner side of a housing part of the housing of the camera also has disadvantages.

However, electrically connecting the circuit board to the usually metallic housing is provided to bring this housing to ground potential.

It is an object of the invention to provide a camera and a method, in which the electrical contact of the circuit board with the housing of the camera is improved.

This object is solved by a camera and a method corresponding to the independent claims.

An aspect of the invention relates to a camera for a motor vehicle. The camera comprises a housing. The housing is formed of an electrically conductive material. Moreover, the camera comprises at least one circuit board arranged in the housing. The camera comprises an electrically conductive circuit board carrier separate to the housing. This circuit board carrier carries the circuit board and is electrically connected to this circuit board. The circuit board carrier is arranged in the housing and connected to the housing in electrically conductive manner. By such a configuration, it is allowed that the circuit board is no longer directly connected to the housing of the camera. Rather, the separate circuit board carrier is provided thereto. Thus, it is an additional part, to which the circuit board is directly attached. Therefore, the circuit board is no longer directly attached to the housing.

On the other hand, in that the circuit board carrier is in turn connected to the housing in electrically conductive manner, thus, an electrical connection is indirectly formed between the circuit board and the housing. Thereby, it is allowed that the housing can be connected to ground potential in simple yet in secure manner.

The circuit board carrier is in particular an inherently dimensionally stable form body. This means that it is correspondingly stiff considered in itself. Thus, it is not only a mere foil inlay without coating or the like. It can also be separately inserted into the housing. It can also be removed from the housing. Therein, the circuit board carrier can respectively be non-destructively detachably inserted or removed.

In particular, the camera comprises a screwing and clamping unit. It is formed separately to the housing. In particular, the circuit board carrier is a constituent of this screwing and clamping unit. By this screwing and clamping unit, it is allowed that a lens device of the camera is directly attached thereto, in particular screwed thereto. Moreover, this screwing and clamping unit is mechanically clamped to inner sides of the housing in a direction perpendicular to a longitudinal axis of the camera. Thereby, it maintains its position in this housing relative to the housing.

In an advantageous embodiment, it is provided that the circuit board carrier comprises at least one clamping element. The circuit board carrier is clamped to an inner side of the housing by this clamping element. In particular, this clamping element is formed integrally with the circuit board carrier. This clamping element is arranged laterally protruding from an edge of the circuit board carrier in a direction perpendicular to the longitudinal axis of the camera. In particular, the circuit board carrier is arranged directly clamped to an inner side of the housing by this clamping element.

Thereby, it is allowed that this circuit board carrier can be directly mechanically connected to the housing in particular without solder joint to the housing. This is a further advantage. Because the housing is in particular formed of a metal, in particular aluminum, at least in certain areas. Aluminum is a particularly advantageous material for this housing. It is light on the one hand. On the other hand, it is particularly robust with respect to environmental influences, to which the camera is exposed at the motor vehicle. Since, as initially mentioned, solder joints with aluminum are difficultly and expensively to produce, this clamping connection is particularly advantageous. In particular, the circuit board carrier is retained in the housing stable in position only by such a clamping connection between the clamping element and the housing. In particular, this clamping element is a constituent of the advantageously formed screwing and clamping unit of the camera.

In an advantageous embodiment, it is provided that the circuit board carrier comprises at least two separate clamping elements. They are formed at different edge sections of the edge of the circuit board carrier. In particular, they are formed at opposing edge sections.

Thereby, particularly stable clamping of the circuit board carrier to opposing inner sides of opposing sidewalls of the housing can be effected. A particularly advantageous clamped state of the circuit board carrier at the housing is thereby achieved.

More than two separate clamping elements can also be formed. In particular, they are each formed at different edge sections of the edge of the circuit board carrier. The clamping elements can be formed as clamping flaps. Then, they in particular protrude from the edge in wing-like manner in this respect.

0 In an advantageous embodiment, it is provided that the circuit board carrier is formed plate-like. Preferably, it comprises a hole. This hole is circumferentially completely bounded. Thus, it is not a hole open on the edge side. A lens device of the camera separate thereto extends into this hole. Thus, the lens device is in particular formed overlapping with this circuit board carrier, in particular with the hole, viewed in the 5 direction of the longitudinal axis of the camera.

In an advantageous embodiment, it is provided that the surface of this circuit board carrier, which is bounded by an edge or an edge contour of this circuit board carrier, is at least 80 percent, in particular at least 90 percent, in particular at least 95 percent of the surface, which is bounded by inner sides of sidewalls of the housing. These respective surfaces are to be understood viewed in a plane perpendicular to the longitudinal axis of the camera. This means that the circuit board carrier has a size, which nearly completely has this surface between the inner sides of the housing. In particular, the circuit board carrier is formed with a surface, which is less than 99 percent, in particular less than 98 percent of this surface between the inner sides of the housing. By such a configuration, it is allowed that a stable circuit board carrier can be formed on the one hand and a clamping element can be formed relatively small viewed in the direction perpendicular to the longitudinal axis of the camera on the other hand. Thereby, the clamping effect can be particularly advantageously achieved. Because a clamping element is thereby also slightly flexible and deformable to some extent. On the other hand, it does not have a length in this respect, which would entail an undesirably high flexibility of the clamping element. Undesired severe bending and optionally break-off of the clamping element is thereby avoided.

In an advantageous embodiment, it is provided that the lens device is attached in the hole of the circuit board carrier. In this context, a retaining mechanical connection can be provided. For example, this can be a threaded connection. In such a configuration, thus, the lens device is retained in the hole by a screw connection. In particular, the lens device is only arranged screwed in this hole. By such a configuration, it is allowed that the lens device does no longer have to be screwed directly to the housing, in particular a housing front part. Forming an internal thread in this housing front part is therefore no longer required. On the one hand, it is thereby allowed to simpler configure the housing in terms of manufacture. On the other hand, it is thereby allowed to arrange the lens device in very stable manner and thus fixed in position by the screwing in the hole of the circuit board carrier.

It can be provided that this screw connection comprises a thread, which is an internal thread. This internal thread can be formed directly at the circuit board carrier in an advantageous implementation. In this context, it can for example be formed at a bounding wall bounding the hole. In this configuration, the lens device is then directly screwed to the circuit board carrier.

In particular, an internal thread is formed in the hole. It is screwed to an external thread formed at the lens device.

In an advantageous embodiment, it is provided that an adhesive is introduced between the internal thread and the external thread. By such a configuration, the screw connection is formed again improved with regard to its fixed connection and permanently stable positional fixing. In particular vibrations, as they are transferred to the camera in the operation of the motor vehicle, then especially do not result in the fact that the screw connection could detach.

In an advantageous embodiment, it is provided that a retaining ring separate to the circuit board carrier and to the housing is arranged in the hole of the circuit board carrier. This retaining ring is a particularly advantageous component. It allows retaining the separate circuit board carrier, the housing part of the housing separate thereto and the lens device in turn separate thereto to each other. The retaining ring is in particular formed to the effect that it directly retains the lens device in its assembled final position in the housing of the camera, on the other hand presses the circuit board carrier to the inner side of the sidewalls of the housing perpendicularly to the longitudinal axis of the camera. In particular such that the circuit board carrier is thereby clamped to this housing.

In its assembled final position, the retaining ring is arranged overlapping with the circuit board carrier at least in certain areas in the direction of the longitudinal axis of the camera.

It is in particular arranged protruding into the hole of the circuit board carrier at least in certain areas. Moreover, the retaining ring is arranged overlapping with the lens device viewed in the direction of the longitudinal axis of the camera.

In an advantageous embodiment, the retaining ring has a shaping, by which the circuit board carrier is pressed outwards perpendicularly to the longitudinal axis of the camera and pressed towards inner sides of longitudinal sides of the housing upon introducing the retaining ring into its final position. By this configuration, the clamping of the circuit board carrier on these inner sides of the sidewalls of the camera then appears. In an advantageous implementation, it is provided that an outer side or a circumferential wall of this retaining ring is not formed completely parallel to the longitudinal axis of the camera. In particular, this retaining ring is formed stepped at its circumferential wall. In particular, this circumferential wall has an oblique section extension (viewed in a cross-section of the retaining ring). By this wall obliqueness, the retaining ring is conically formed at its outer contour at least in certain areas. In particular, it is provided that the bounding wall bounding the hole in the circuit board carrier is not completely vertically formed and thus is not formed completely parallel to the longitudinal axis of the camera. In particular, this bounding wall is formed with a bounding wall obliqueness viewed in a cross-section. In particular, the bounding wall of the hole is thus formed funnel-like in certain areas. By this bounding wall obliqueness and the wall obliqueness, a complementary geometry is thus provided. By it, upon inserting the retaining ring into the hole and upon moving the retaining ring in the direction of the longitudinal axis relative to the circuit board carrier, abutment of this wall obliqueness and the bounding wall obliqueness on each other is achieved. Upon further axially moving the retaining ring relative to the circuit board carrier, these mentioned wall obliquenesses slide on each other and the circuit board carrier is pressed outwards perpendicularly to the longitudinal axis. The at least one clamping element is then pressed onto the inner side of the sidewall of the housing such that the clamping effect is established.

In an advantageous embodiment, it is provided that the retaining ring comprises an engagement contour on a top side facing away from the lens device. A tool can for example engage with this engagement contour to be able to apply a torque to the retaining ring around the longitudinal axis of the camera.

In particular, it is provided that the retaining ring comprises an internal thread on its inner side. An external thread formed at the lens device can be screwed into this internal thread. Thus, in this embodiment, the lens device can be directly screwed to the retaining ring. When the lens device is screwed to this retaining ring, thus, the lens device moves towards the retaining ring in the direction of the longitudinal axis of the camera. This is effected until an abutment surface of a lens device abuts on a mating abutment surface of a housing flange of the housing, in particular a housing front part of the housing. In this state, upon further rotating the lens device into the retaining ring, the retaining ring is then pulled into the hole or further into the hole of the circuit board carrier in axial direction. Thereby, moving the circuit board carrier perpendicularly to the longitudinal axis and the clamping of the clamping elements of the circuit board carrier to the inner side of the housing, in particular of a housing front part of the housing, already above explained are effected.

In an advantageous embodiment, it is provided that the retaining ring comprises an integrated internal thread. Thus, the internal thread is formed integrally with the retaining ring. In particular, the retaining ring is formed as an integral component. The internal thread is screwed to an external thread arranged at the lens device.

In an advantageous embodiment, the retaining ring is a constituent of the above mentioned screwing and clamping unit of the camera.

In an advantageous embodiment, it can be a component separate to the circuit board carrier.

It can also be provided that the circuit board carrier and the retaining ring are integrally formed. However, this integral configuration is in particular such that the retaining ring and the circuit board carrier are movable relative to each other. In particular, this is seen in the direction of a longitudinal axis of the camera. This longitudinal axis of the camera is in particular also the hole axis of the hole of the circuit board carrier. In particular, it is also the longitudinal axis of the retaining ring. For example, it can be provided that with such an integral configuration of the circuit board carrier and the retaining ring, these two components are connected by at least one elastic element. For example, this can be an elastic bracket. However, it can also be an elastic spring. For example, this can be a type of leaf spring. In particular, multiple such elastic elements can be provided.

In particular, the retaining ring is formed of an electrically conductive material. With an integral configuration between the retaining ring and the circuit board carrier, this entire integral component is in particular formed of an electrically conductive material.

In an advantageous embodiment, it can be provided that the retaining ring is a clamping ring, by which the circuit board carrier is pressed onto the inner side of the housing perpendicularly to the longitudinal axis of the camera.

In an advantageous embodiment, it is provided that the retaining ring has a stepped outer wall or circumferential wall. As already set forth above, a wall obliqueness or an outer wall obliqueness is formed at it. A bounding wall bounding the hole in the circuit board carrier comprises a complementarily inclined wall obliqueness or bounding wall obliqueness. The 0 outer wall obliqueness abuts on this wall obliqueness.

In an advantageous embodiment, it is provided that the lens device is only screwed to the internal thread separate from the housing. In particular, a direct screw connection between the housing and the lens device is not formed.

Thus, the lens device is only passed through an opening or a hole in the housing, in particular a housing front part, and extends on both sides of this hole. In particular, the lens device abuts on an abutment surface or an end surface of a bounding wall bounding the hole in the housing with a radial flange.

Preferably, it is provided that the lens device abuts on a mating abutment surface of a housing flange of the housing with an abutment surface. The housing flange bounds a hole in the housing. The lens device extends into the interior of the housing through this hole.

In an advantageous embodiment, it is provided that the abutment surface is pressed onto the mating abutment surface by the screw connection viewed in the direction of the longitudinal axis of the camera. Thus, axially pressing this abutment surface onto the mating abutment surface is achieved by this screw connection.

Preferably, it is provided that the circuit board carrier comprises at least two contact pins. These contact pins are integrally formed at the circuit board carrier. These contact pins are fixedly connected to the circuit board. Here, an electrically conductive connection between the contact pins and the circuit board is in particular formed. In particular, it is provided that the contact pins are each connected to the circuit board by a solder joint.

In an advantageous embodiment, it is provided that the circuit board carrier comprises at least one stiffening web. Thereby, this circuit board carrier is particularly stiffly formed. An undesired torsion is thereby avoided. In particular, the stiffening web is formed as a circumferentially closed stiffening web.

Moreover, it can also be provided that the camera comprises a dust protection shield. It is preferably arranged in the housing. Thereby, it is avoided that dust can get into an optical path between the lens device and the image sensor, which is arranged on the circuit board. This dust protection element is preferably arranged at the retaining ring. In particular, it is also annularly formed and formed circumferentially closed around the 0 longitudinal axis of the camera. In axial direction, that clearance between the image sensor and the lens device is thereby circumferentially covered around the longitudinal axis. In particular, this dust protection element is formed elastically in axial direction.

In a further independent aspect of the invention, a camera for a motor vehicle comprises a 5 housing. This housing is formed of an electrically conductive material at least in certain areas. Moreover, the camera comprises at least one circuit board. This circuit board is arranged in the housing. The camera comprises a retaining ring separate to the housing. This retaining ring is also formed separate to the circuit board. The retaining ring is arranged in the housing. Moreover, the camera comprises a lens device. It extends into 0 the interior of the housing through a hole in the housing. The lens device comprises an external thread. It is screwed to an internal thread formed in the retaining ring. In particular, only a screw connection between the retaining ring and the lens device is formed. Thus, the lens device is only directly screwed to the retaining ring.

A further independent aspect of the invention relates to a camera for a motor vehicle. The camera comprises a housing. The housing is formed of an electrically conductive material at least in certain areas. Moreover, the camera comprises at least one circuit board. The circuit board is arranged in the housing. The camera comprises a screwing-clamping unit separate to the housing. A lens device is directly screwed to the camera at this screwing-clamping unit. Moreover, the screwing-clamping unit is arranged clamped to an inner side of the housing in the direction perpendicular to a longitudinal axis of the camera.

Implementations of the first independent aspect relating to the camera are to be regarded as advantageous implementations of the above mentioned further independent aspects.

A further aspect of the invention relates to a method for assembling a camera comprising a housing which is formed of an electrically conductive material, and comprising at least one circuit board arranging in the housing. Said circuit board is carried by an electrically conductive circuit board carrier, which is separate to the housing. Said circuit board carrier is electrically conducted with the circuit board, wherein the circuit board carrier is arranged in the housing and is electrically conducted with the housing.

Preferred embodiments of the camera are preferred embodiments of the method. Components of the camera are alone or in interaction with other components configured to perform the steps of the method.

Further features of the invention are apparent from the claims, the figures and the description of figures. The features and feature combinations mentioned above in the description as well as the features and feature combinations mentioned below in the description of figures and/or shown in the figures alone are usable not only in the respectively specified combination, but also in other combinations without departing from the scope of the invention. Thus, implementations are also to be considered as encompassed and disclosed by the invention, which are not explicitly shown in the figures and explained, but arise from and can be generated by separated feature combinations from the explained implementations. Implementations and feature combinations are also to be considered as disclosed, which thus do not have all of the features of an originally formulated independent claim. Moreover, implementations and feature combinations are to be considered as disclosed, in particular by the implementations set out above, which extend beyond or deviate from the feature combinations set out in the relations of the claims.

Now, the invention is explained in more detail based on preferred embodiments as well as with reference to the attached drawings.

There show.

In the figures, identical and functionally identical elements are provided with the same reference characters.

Figure 1:
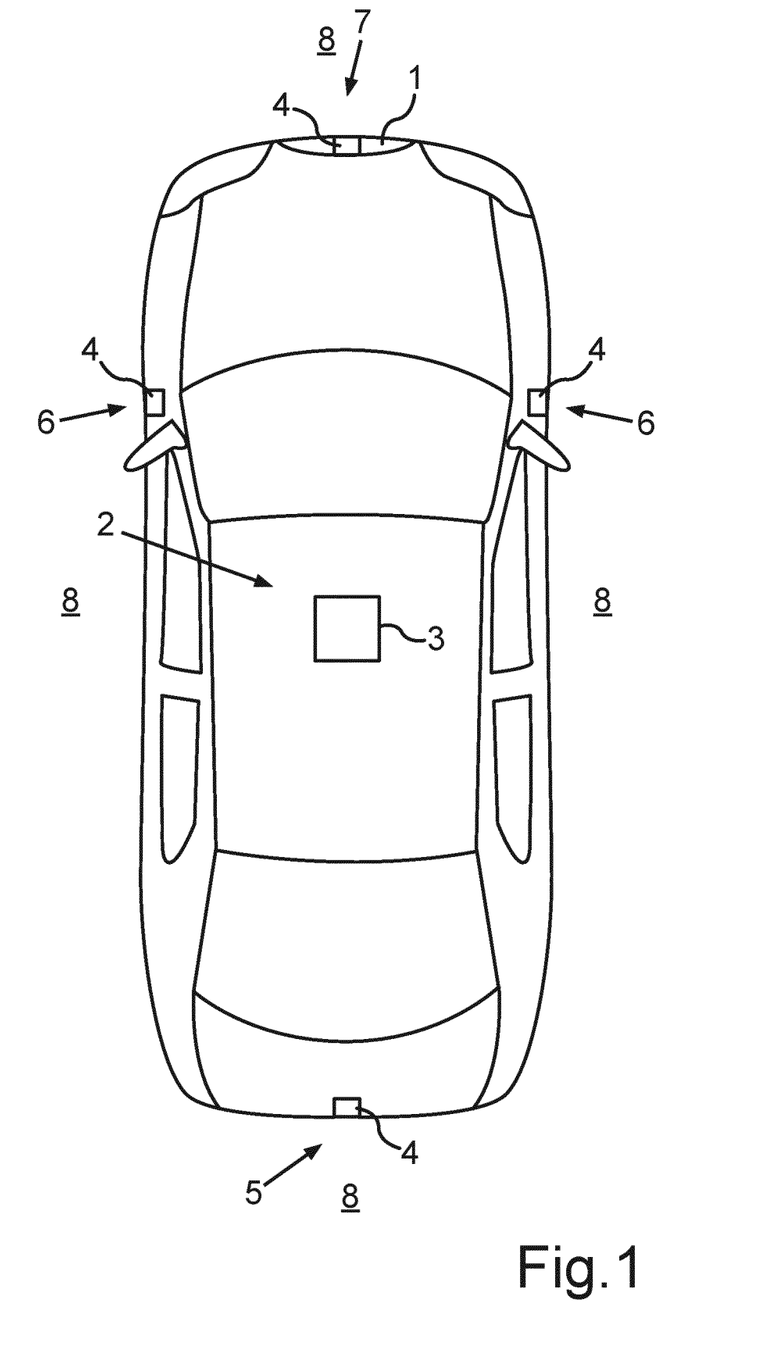
FIG. 1 a motor vehicle according to an embodiment of the invention, which comprises a camera system with multiple cameras.

FIG. 1 shows a motor vehicle 1 according to an embodiment of the present invention in a top view. In the present case, the motor vehicle 1 is formed as a passenger car. The motor vehicle 1 comprises a camera system 2. The camera system 2 in turn comprises a computing device 3, which can for example be formed by an electronic control device of the motor vehicle 1. Moreover, the camera system 2 comprises at least one camera 4. In the present embodiment, the camera system 2 comprises four cameras 4, which are arranged distributed at the motor vehicle 1. Presently, one of the cameras 4 is arranged in a rear area 5, one of the cameras 4 is arranged in a front area 7 of the motor vehicle 1 and the remaining two cameras 4 are arranged in a respective lateral area 6, in particular in an area of the wing mirrors. Presently, the number and arrangement of the cameras 4 of the camera system 2 are to be purely exemplarily understood.

In addition thereto or instead thereof, at least one camera can also be provided, which is formed and arranged for capturing an interior or a passenger compartment of the motor vehicle 1. The cameras 4 are in particular each installed such that they are mounted on an individual motor vehicle component. A motor vehicle component can for example be a bumper or an exterior mirror or a side trim panel. The motor vehicle component can for example also be a headliner or an interior trim or an interior mirror. The motor vehicle components are only to be exemplarily understood and other motor vehicle components can also be present. Thereby, it is only expressed that a motor vehicle component can be very diversely formed with respect to positional arrangement and material configuration.

An environmental region 8 of the motor vehicle 1 can be captured by the cameras 4. Preferably, the four cameras 4 are formed identical in construction. In particular, an image sequence or video data can be provided by the cameras 4, which describes the environmental region 8. This video data can be transmitted from the cameras 4 to the computing device 3. A display device of the motor vehicle 1 not illustrated here can be controlled by means of the computing device 3 such that the video data of the cameras 4 can be displayed to the driver. Thus, the camera system 2 serves for assisting the driver of the motor vehicle 1 in driving the motor vehicle 1. The camera system 2 can for example be a so-called electronic rearview mirror or a parking assistance system or another system. It can also be formed in the interior for capturing a person, in particular a vehicle driver.

Figure 2:
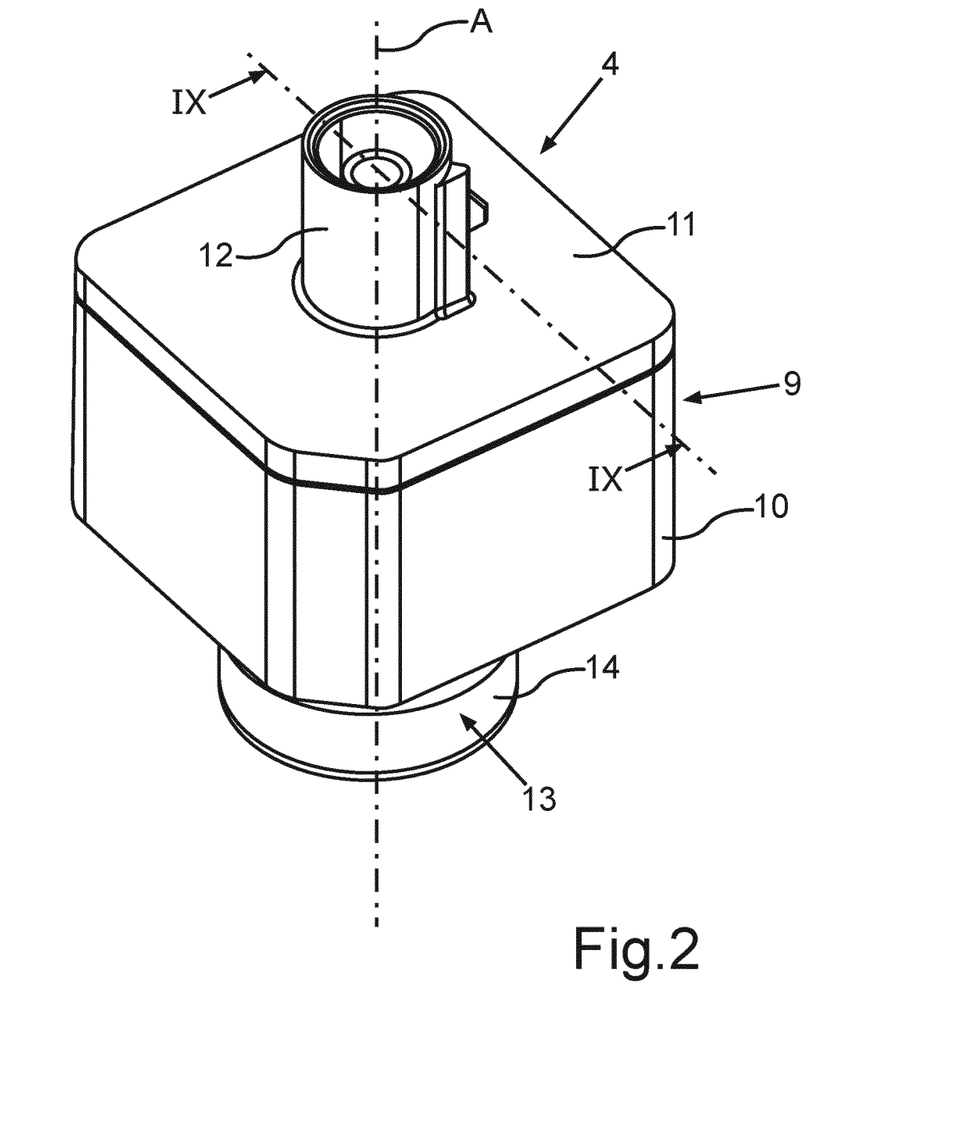
FIG. 2 a perspective representation of an embodiment of a camera according to the invention.

In FIG. 2, an embodiment of a camera 4 is shown in a perspective representation. The camera 4 comprises a housing 9. This housing 9 is formed of an electrically conductive material at least in certain areas. In particular, the housing 9 is formed of aluminum. The housing 9 comprises a housing front part 10 in an advantageous implementation. Moreover, it comprises a housing rear part 11 separate to the housing front part 10. A terminal 12 is formed in the housing rear part 11. A plug not shown with a cable can be connected thereto. Thereby, electrical signals, in particular data signals and/or energy transfer signals, can be transferred to the camera 4 or be transferred away from it. In particular, grounding or ground potential for the camera 4 can also be provided via this terminal. Moreover, the camera 4 comprises a lens device 13 separate to the housing 9. The lens device 13 comprises a lens housing 14. An optical element, in particular a lens, is arranged in it. Multiple lenses can also be arranged therein.

Figure 3:
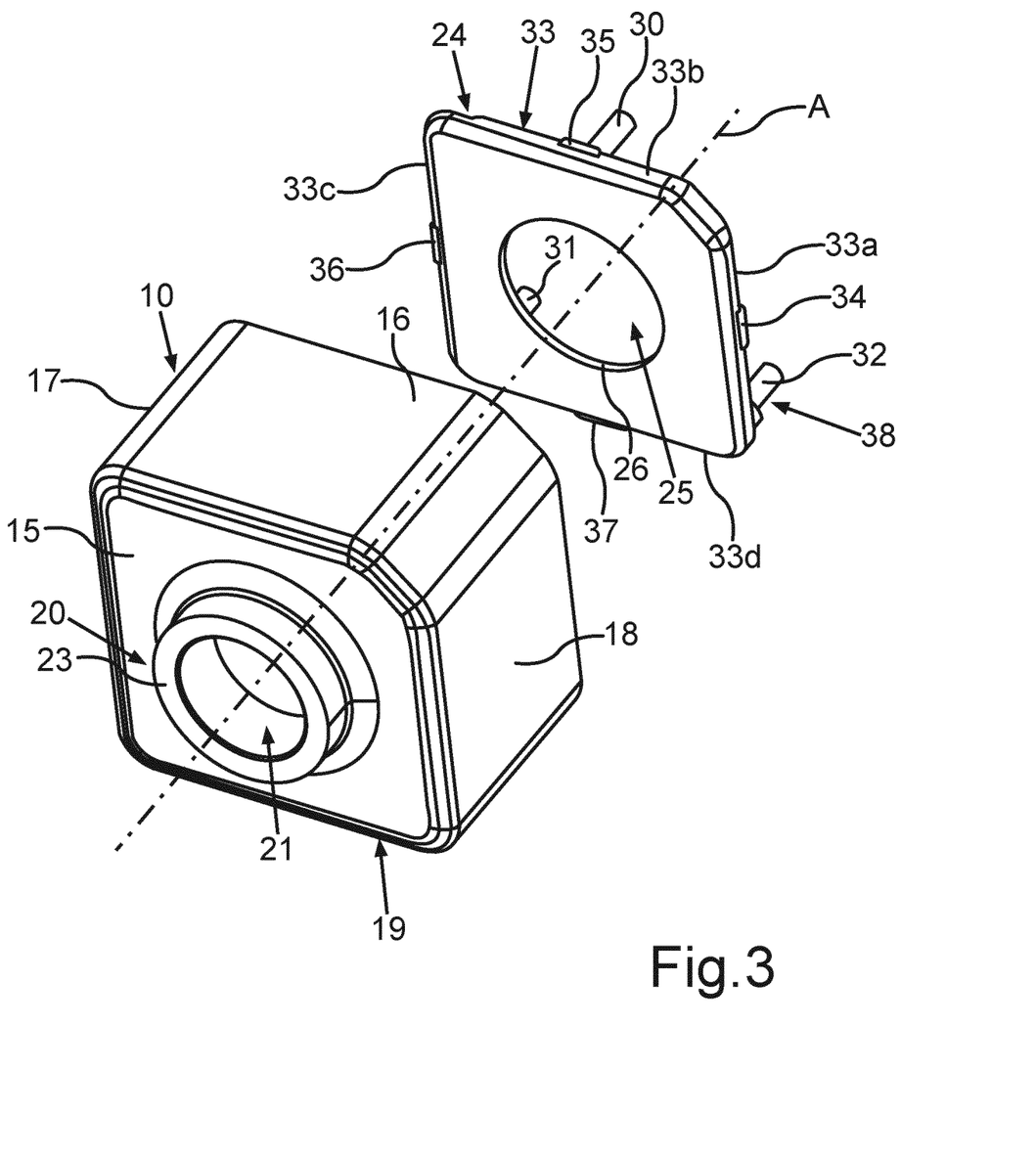
FIG. 3 an exploded representation of two partial components of the camera according to FIG. 2.

In FIG. 3, the housing front part 10 is shown in an exploded representation. The housing front part 10 comprises a front wall 15. Moreover, it comprises sidewalls 16, 17, 18 and 19. A housing flange 20 is integrally formed in the front wall 15. In particular, the housing front part 10 is integrally formed. In this housing front flange 20, a continuous hole 21 is formed. The lens device 13 extends through it and into the interior 22 (FIG. 4) of the housing 9, in particular of the housing front part 10.

The housing front flange 20 comprises a front side 23. This front side 23 or this end side circumferentially bounds the hole 21.

The camera 4 has a longitudinal axis A as it is shown in FIG. 2 and FIG. 3. In particular, this longitudinal axis A is also the hole axis of the hole 21. A mating abutment surface for an abutment surface of the lens device 13 is formed by this front side 23.

Moreover, a circuit board carrier 24 separate to the housing 9, in particular to the housing front part 10, is shown in FIG. 3. The circuit board carrier 24 is an integral component. It is in particular formed of an electrically conductive material. In particular, it is formed of metal. Preferably, the metal, of which the circuit board carrier 24 is formed, is a metal different from aluminum. The circuit board carrier 24 is plate-like formed, and may for instance comprise electroplated tin that may be used for a soldering process that retains circuit board to circuit board carrier. It comprises a hole 25. The hole 25 is circumferentially completely closed. In particular, this hole 25 is circumferentially closed by a bounding wall 26. In particular, the circuit board carrier 24 is formed of a zinc-plated material. In particular, the circuit board carrier 24 is formed of zinc-plated brass or tin-plated brass.

Figure 4:
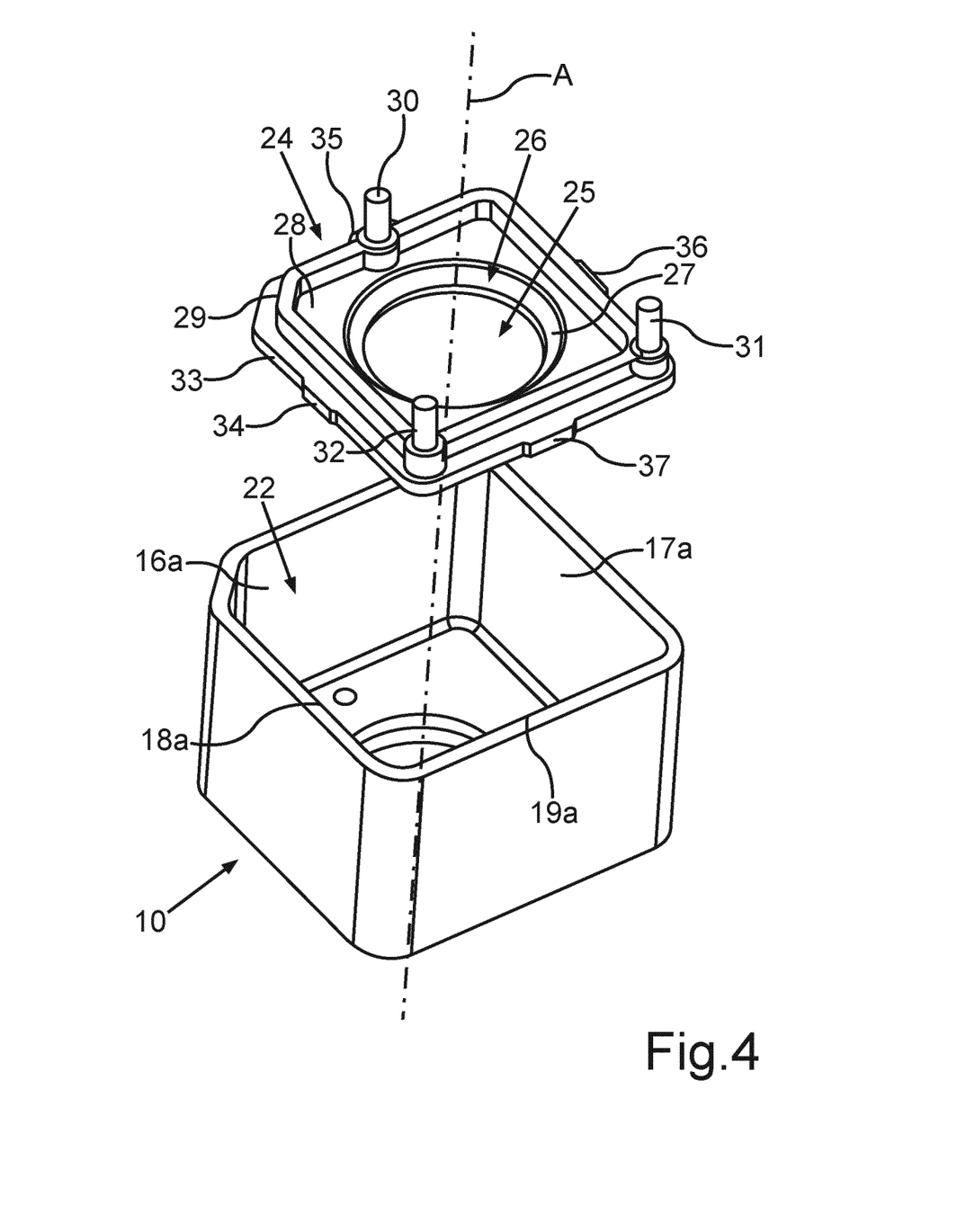
FIG. 4 a representation of the components according to FIG. 3 in a perspective different from FIG. 3.

In FIG. 4, the arrangement of the components according to FIG. 3 is shown in a perspective different from FIG. 3. It is apparent that the circuit board carrier 24 comprises the bounding wall 26 for the hole 25, which is not formed completely parallel to the longitudinal axis A. In particular, the bounding wall 26 comprises a wall obliqueness 27. Thereby, a funnel-like geometry of the hole 25 is formed. Furthermore, it is apparent that the circuit board carrier 24 comprises a stiffening web 29 standing raised to the top on a top side 28. The stiffening web 29 is formed circumferentially closed. In this context, the top side 28 faces away from the front wall 15. The top side 28 faces the housing rear part 11.

Moreover, the circuit board carrier 24 comprises multiple contact pins 30, 31 and 32. These contact pins 30 to 32 protruding on the top side 28 towards the housing rear part 11 are provided for electrically contacting the circuit board of the camera 4 not yet shown.

Moreover, in FIG. 4 as well as in FIG. 3, it is apparent that the circuit board carrier 24 comprises an edge 33. In the embodiment, multiple clamping elements (also referred to in the following as locating elements prior to clamping) are formed on this narrow side, which is the edge 33, of the circuit board carrier 24. In particular, four clamping elements 34, 35, 36 and 37 are formed in the embodiment. The clamping elements 34 to 37 are formed integrally with the circuit board carrier 24. They extend perpendicularly to the longitudinal axis A laterally outwards from the edge 33. As is apparent, each clamping element 34 to 37 is formed at an own edge section 33a, 33b, 33c and 33d of the edge 33.

The circuit board carrier 24 is arranged clamped to inner sides 16a, 17a, 18a and 19a of 5 the sidewalls 16 to 19 of the housing front part 10 in the installed state by these clamping elements 34 to 37. This means that a clamping effect perpendicular to the longitudinal axis A is here established. The clamping is substantially parallel to longitudinal axis A and the edges 33 and the clamping elements 34 to 37 locate the parts relative to longitudinal axis A before all elements are tightly put in place. In this context, the clamping elements 34 to 37 then directly abut on these inner sides 16a to 19a in mechanically clamping manner.

Figure 5:
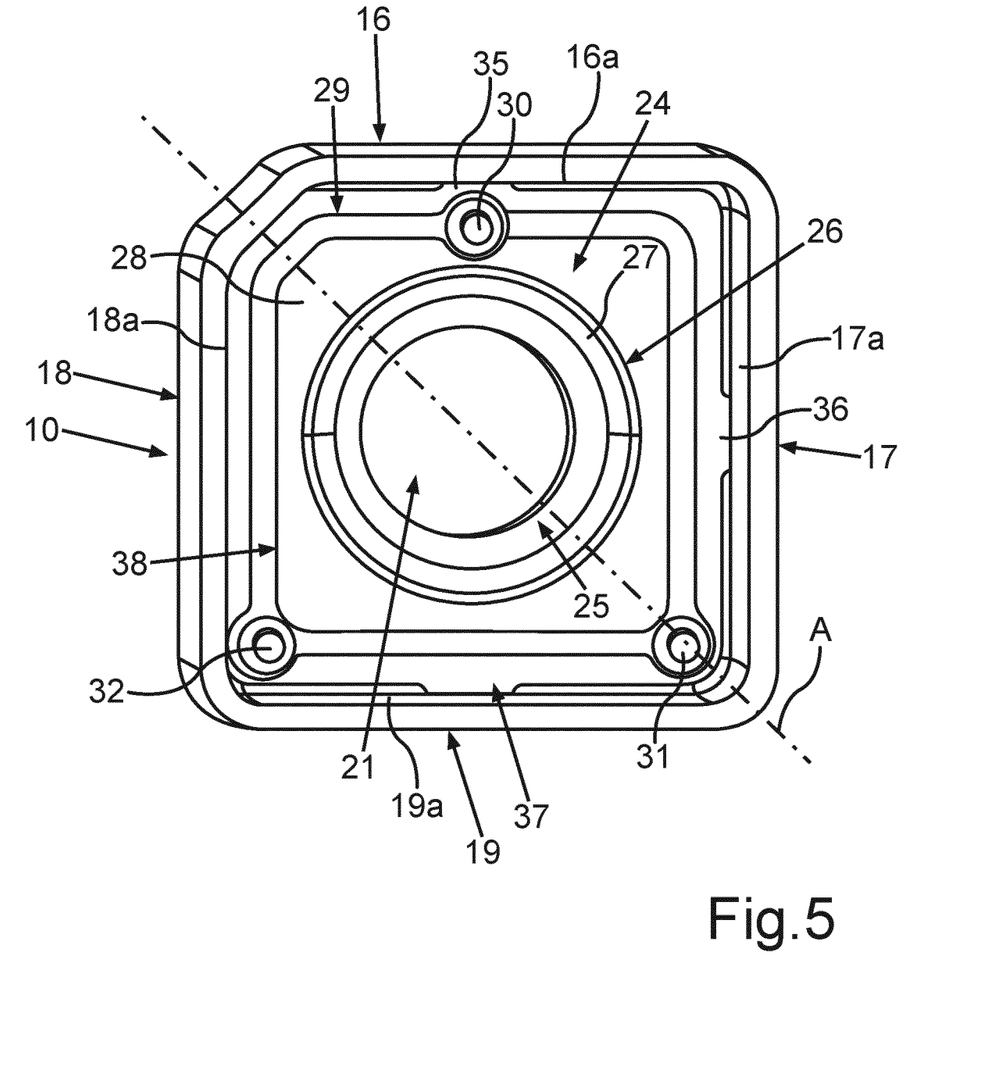
FIG. 5 the representation of the components according to FIG. 3 and FIG. 4 in the state assembled to each other.

In FIG. 5, the installed state of the circuit board carrier 24 in the interior 22 of the housing front part 10 is shown in a perspective representation. As is therein apparent, the circuit board carrier 24 comprises a surface viewed in a plane perpendicular to the longitudinal axis A, which is at least 80 percent, in particular at least 90 percent, in particular at least 95 percent, but less than 99 percent of that surface, which is bounded by the inner sides 16a to 19a viewed perpendicularly to this longitudinal axis A. Moreover, it is apparent that the holes 21 and 25 are arranged to each other such that a continuous overall hole is formed.

In particular, it is provided that the circuit board carrier 24 is a constituent of a screwing and clamping unit 38 of the camera 4.

Figure 6:
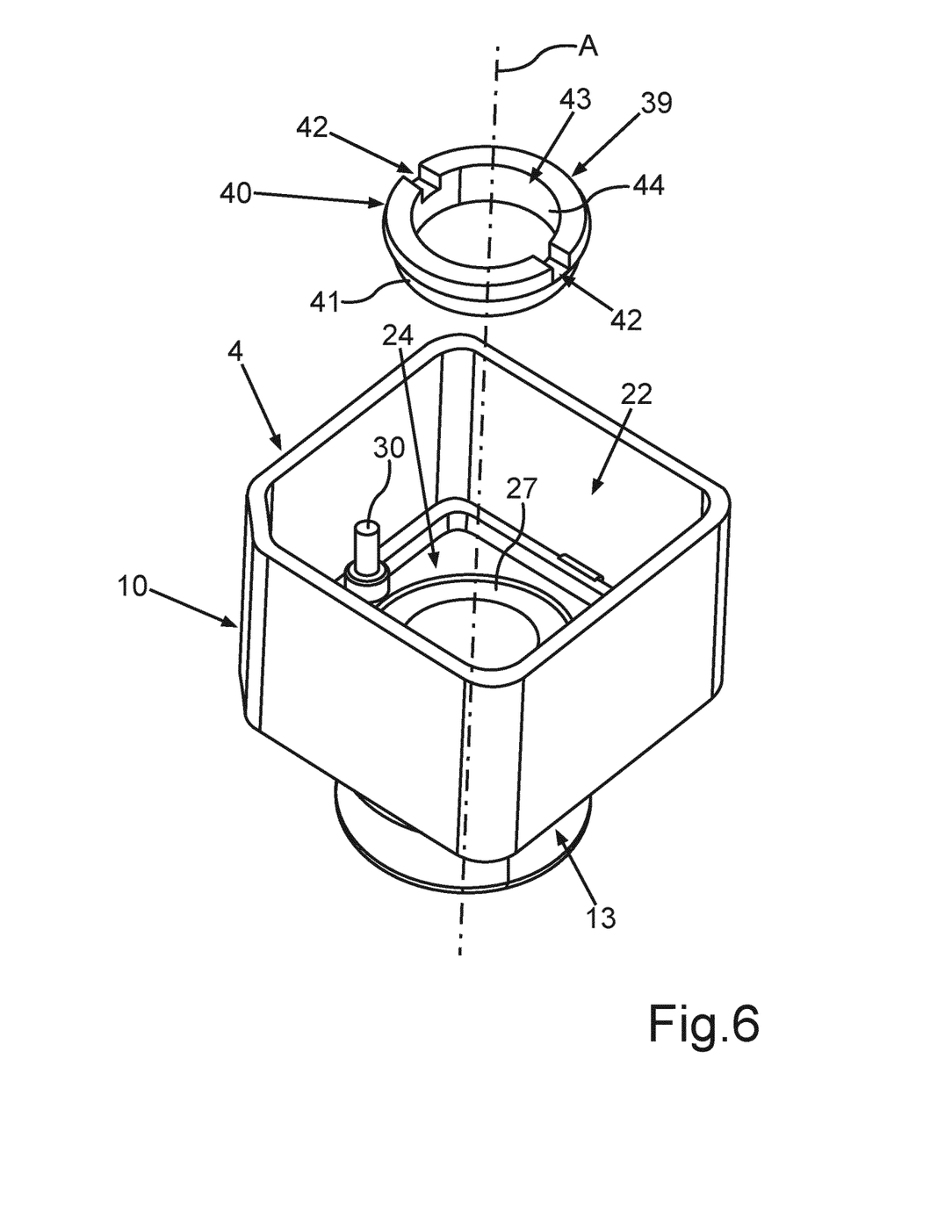
FIG. 6 a perspective representation of partial components of the camera according to FIG. 2.

In FIG. 6, an arrangement of components of the camera 4 is shown in a further perspective representation. Here, the housing front part 10 with the circuit board carrier 24 installed therein is shown. Moreover, it is apparent here that the lens device 13 is passed into the interior 22 through the hole 21. Therein, the lens device 13 also extends into the hole 25 viewed in axial direction and thus in the direction of the longitudinal axis A.

In an advantageous embodiment, the camera 4 comprises a retaining ring 39. This retaining ring 39 is separate to the housing 9 as well as to the circuit board carrier 24 in an advantageous implementation. This means that it is an own component. This retaining ring 39 is preferably integrally formed. The retaining ring 39 can be formed of an electrically conductive material or of an electrically non-conductive material. The retaining ring 39 comprises an outer wall 40. The outer wall 40 is the circumferential wall of the retaining ring 39. In particular, this outer wall 40 is formed stepped. Preferably, the outer wall 40 comprises an outer wall obliqueness 41. In particular, the retaining ring 39 comprises an engagement contour 42. An assembly tool can engage with this engagement contour 42. Thereby, the retaining ring 39 can be rotated around the longitudinal axis A of the camera 4, which is in particular also the longitudinal axis of the retaining ring 39. Thus, a torque can in particular be applied to the retaining ring 39 around this longitudinal axis A. Here, the engagement contour 42 is in particular an engagement groove.

In particular, the retaining ring 39 is a clamping ring. The circuit board carrier 24 can be pressed outwards towards the inner sides 16a to 19a in the direction perpendicular to the longitudinal axis A by this clamping ring and then a clamping effect can be established by this pressing. In an advantageous implementation, the retaining ring 39 comprises an internal thread 44 on an inner side 43. An external thread 45 (FIG. 9), which is formed on an outer side of a rear part 46 (FIG. 9) of the lens device 13, can be directly screwed to this internal thread 44.

In a further embodiment, it can be provided that the retaining ring 39 is a constituent of the screwing and clamping unit 38.

In an embodiment, it can be provided that the retaining ring 39 and the circuit board carrier 24 are not separate components. In this implementation, it can then be provided that the circuit board carrier 24 and the retaining ring 39 are integrally formed. Then, they form the screwing and clamping unit 38 by this integral component. However, with such an integral configuration, it is to be provided that the retaining ring 39 is movable relatively to the circuit board carrier 24. Here, a corresponding relative movement is to be allowed in particular in the direction of the longitudinal axis A. For example, the retaining ring 39 and the circuit board carrier 24 can then be connected to each other by elastically deformable brackets.

Figure 7:
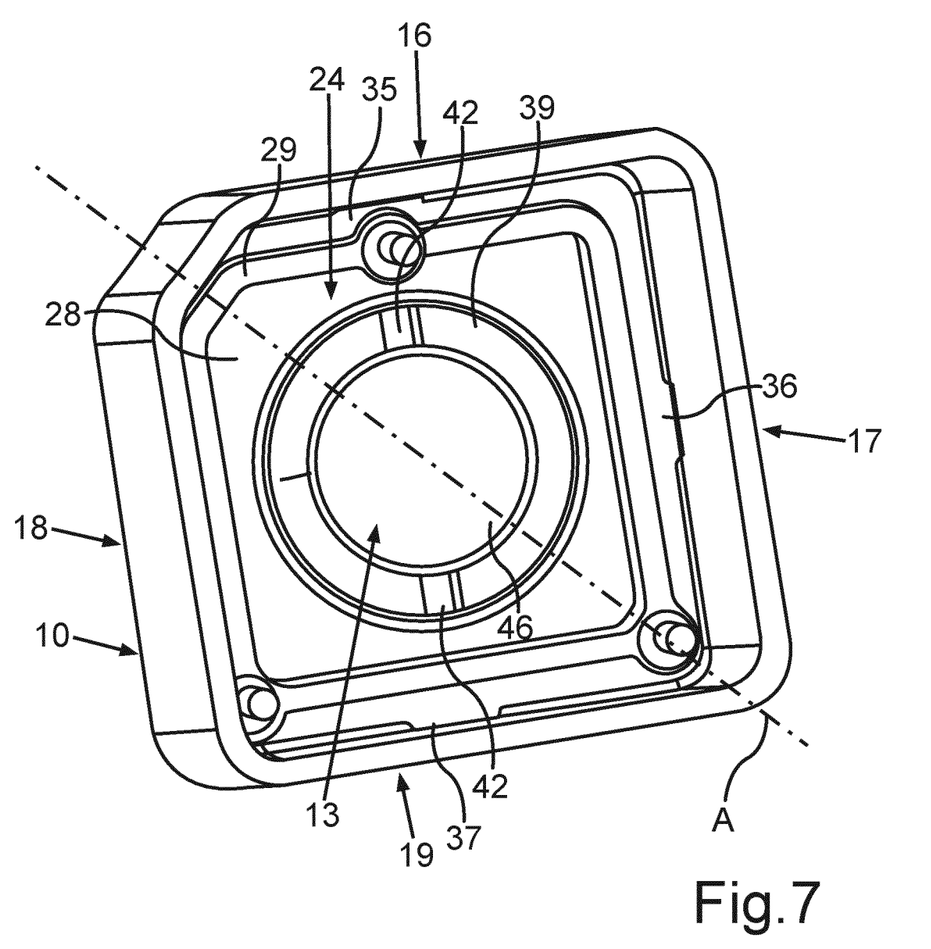
FIG. 7 the representation of the components according to FIG. 6 in the state assembled to each other.

In FIG. 7, a perspective representation of the components according to FIG. 6 is shown. However, the retaining ring 39 is here shown in its installed final position.

Figure 8:
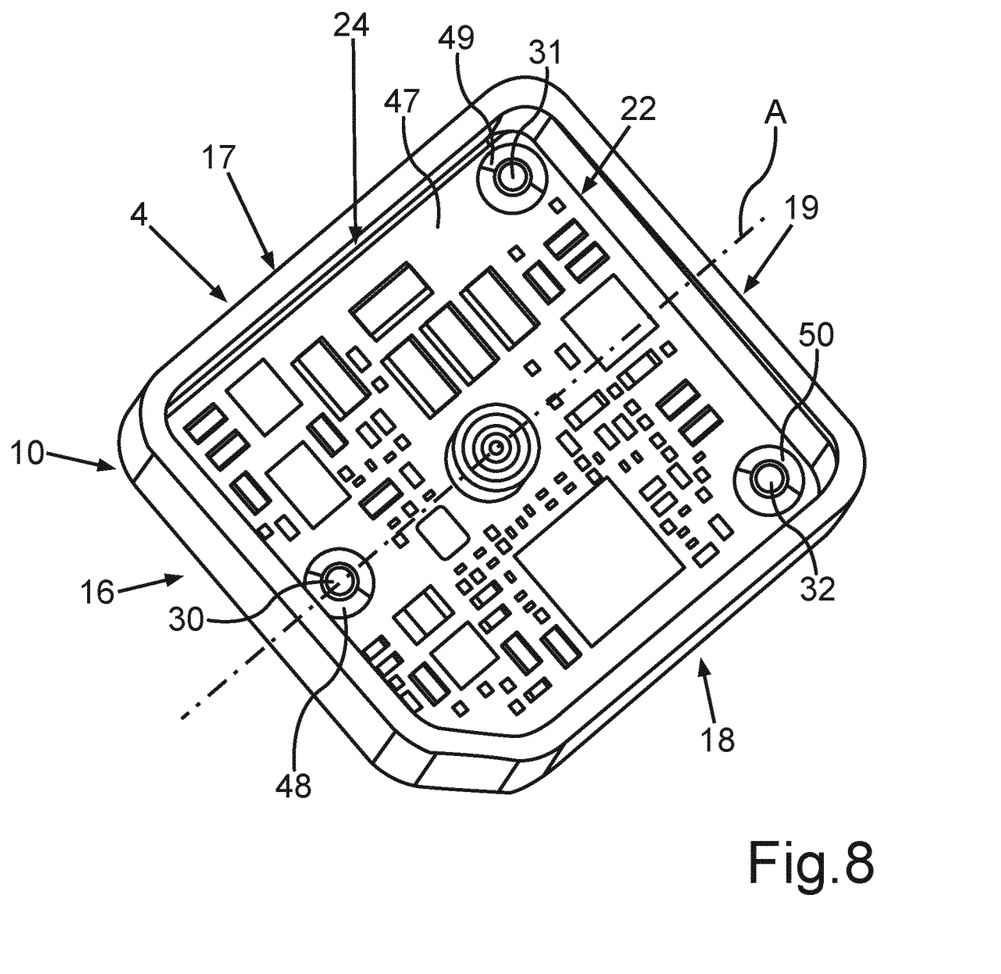
FIG. 8 a further perspective representation of components of the camera according to FIG. 2 with a circuit board of the camera already installed in the housing.

In FIG. 8, the camera 4 with partial components is shown in a further perspective representation. Here, it is apparent that a circuit board 47 of the camera 4 is present. The circuit board 47 is already received in the interior 22 of the housing front part 10. The 0 circuit board 47 is shown in its installed final position. Therein, it is apparent that the contact pins 30 to 32 are each passed through holes in the circuit board 47 and are soldered to the circuit board 47 by solder joints 48, 49 and 50. Thereby, an electrical contact between the circuit board 47 and the electrically conductive contact pins 30 to 32 is formed. In particular, it can thus be achieved that the housing 9 is connected to ground 5 potential if a plug is then connected to the terminal 12 and a ground line is then passed to the camera 9 in this respect.

Figure 9:
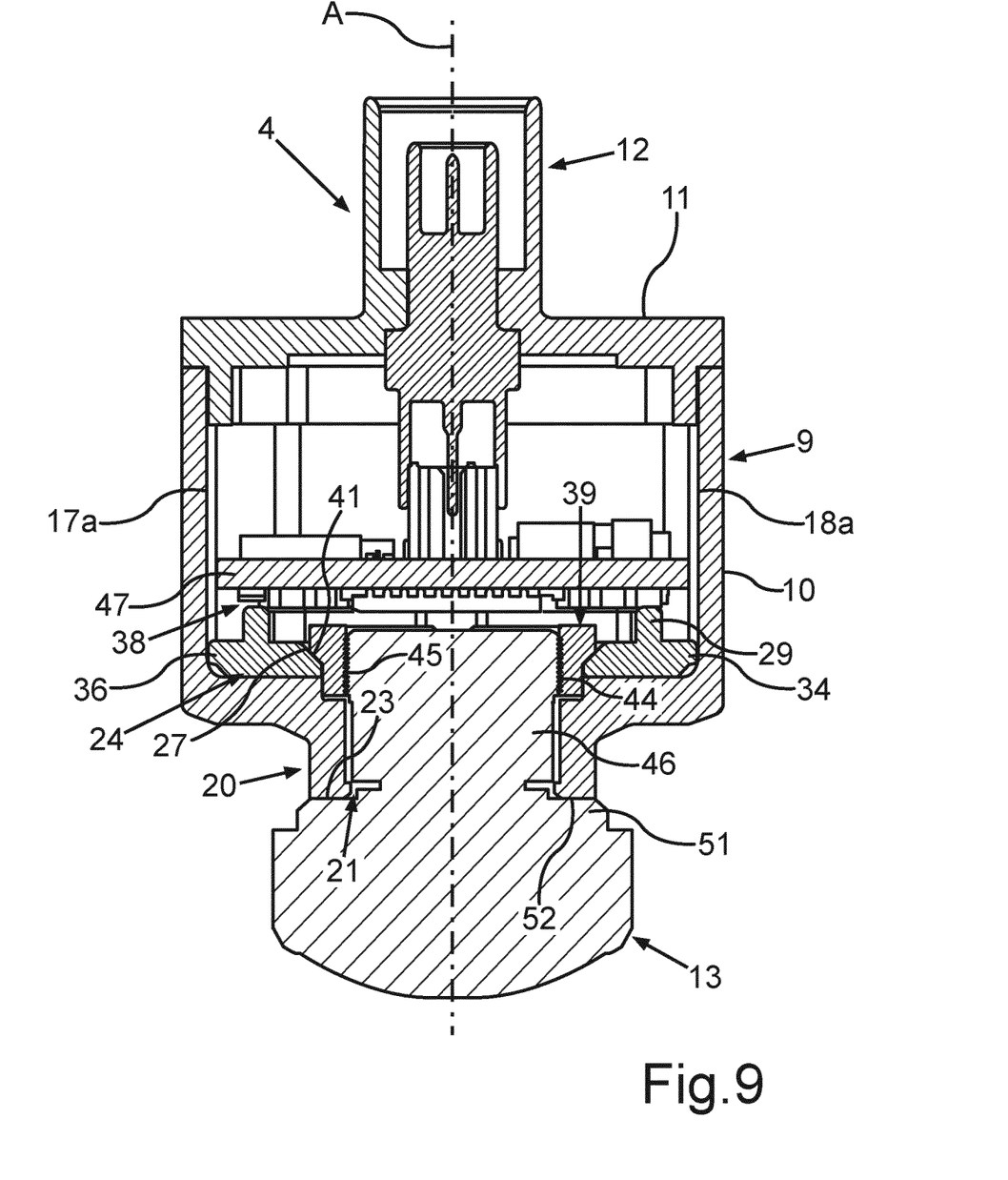
FIG. 9 a vertical sectional representation of the camera according to FIG. 2.

In FIG. 9, the camera 4 according to FIG. 2 is shown in a vertical sectional representation. It is apparent that the lens device 13 is arranged on both sides of the hole 21. The lens 0 device 13 is only screwed to the retaining ring 39. A screw connection between the lens device 13 and the housing 9 is not formed. In particular, a direct screw connection between the lens device 13 and the housing front part 10 is not formed.

As is moreover apparent in FIG. 9, the lens device 13 abuts on the mating abutment surface 23 of the housing flange 20 with a flange 51 comprising the abutment surface 52.

Thereby, the lens device 13 is axially supported on this housing flange 20. By the screw connection, which is formed by the internal thread 44 and the external thread 45, the lens device 13 is axially pressed onto the mating abutment surface 23. As is moreover apparent, the outer wall obliqueness 41 arranged inclined to the longitudinal axis A directly abuts on the wall obliqueness 27 of the bounding wall 26 inclined complementarily thereto.

In FIG. 9, a sectional representation along the sectional line IX-IX in FIG. 2 is shown. It is apparent that the clamping elements 34 and 36 are pressed onto the inner sides 17a and 18a viewed perpendicularly to the longitudinal axis A and pretensioned. Thereby, a corresponding clamping effect is formed in this direction perpendicular to the longitudinal axis A. This achieved in that upon screwing the lens device 13 into the retaining ring 39, this retaining ring 39 and the lens device 13 are moved towards each other in axial direction. Thereby, the retaining ring 39 is pulled towards the bottom by the lens device 13, in particular if the abutment surface 52 abuts on the mating abutment surface 23. By further screwing to each other between the retaining ring 39 and the lens device 13, the outer wall obliqueness 41 slides downwards along the wall obliqueness 27. Thereby, the circuit board carrier 24 is pressed outwards perpendicularly to the longitudinal axis A and thus pressed onto the inner sides 16a to 19a. In particular, this can still be supplemented by engaging with the engagement contour 42 with a tool and thereby performing a corresponding rotational movement of the retaining ring 39 around the longitudinal axis A.

Figure 10:
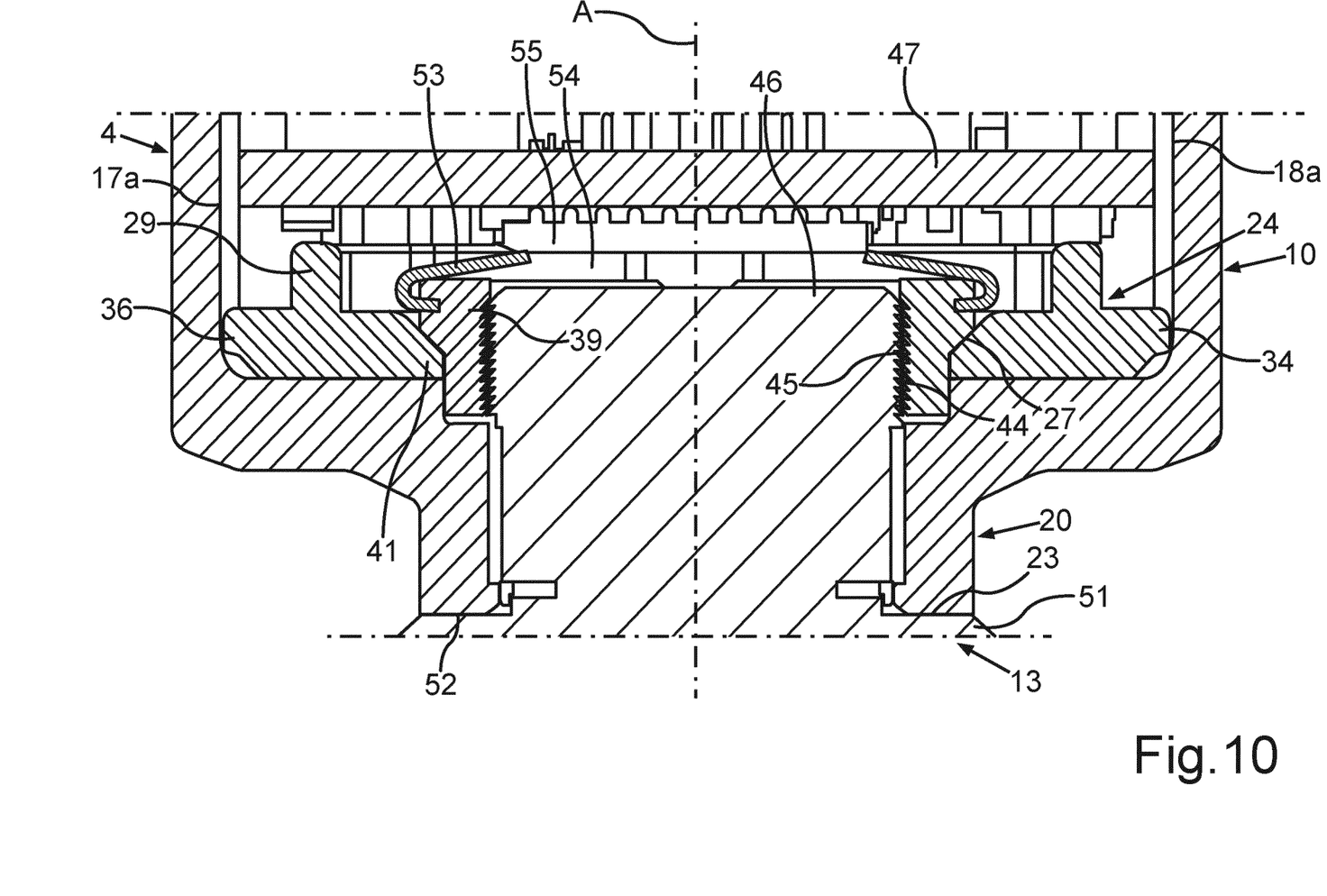
FIG. 10 a representation of a partial area of a further vertical sectional representation of an embodiment of a camera according to the invention.

In FIG. 10, a further embodiment of the camera 4 is shown in a partial area in a further vertical sectional representation. In this embodiment, an additional dust protection element 53 is provided in contrast to FIG. 9. It is in particular attached to the retaining ring 39. By this dust protection element 53, which is formed circumferentially around the axis A 5 and annularly configured in this respect, it is avoided that dust can get into an area 54 between the rear part 46 of the lens device 13 and an image sensor 55 of the camera. Thereby, the optical path between the lens device 13 and the image sensor 55 is protected from dust. This dust protection element 53 can be formed elastically in the direction of the longitudinal axis A. The image sensor 55 is arranged on the circuit board 47.

The invention claimed is:

1. A camera for a motor vehicle, comprising:
a housing, which is formed of an electrically conductive material, with at least one circuit board, arranged in the housing; and
an electrically conductive circuit board carrier separate to the housing, which carries the circuit board and is connected to the circuit board in electrically conductive manner,
wherein the circuit board carrier is arranged in the housing and is connected to the housing in electrically conductive manner,
wherein the circuit board carrier is formed plate-like and comprises an opening into which a lens device of the camera extends,
wherein a retaining ring separate to the housing is arranged in the opening and comprises an integrated internal thread that is screwed to an external thread at the lens device.

2. The camera according to claim 1, wherein the circuit board carrier comprises at least one clamping element, by which the circuit board carrier is clamped onto an inner side of the housing.

3. The camera according to claim 1, wherein the lens device is attached in the hole is attached by a screw connection.

4. The camera according to claim 3, wherein an internal thread is formed in the hole, which is screwed to an external thread at the lens device.

5. The camera according to claim 4, wherein an adhesive is introduced between the internal thread and the external thread.

6. The camera according to claim 1, wherein the retaining ring is a clamping ring, by which the circuit board carrier is pressed onto the inner side of the housing.

7. The camera according to claim 1, wherein the retaining ring comprises a stepped outer wall with an outer wall obliqueness, and a bounding wall bounding the hole in the circuit board carrier comprises a complementarily inclined wall obliqueness, wherein the outer wall obliqueness abuts on the wall obliqueness.

8. The camera according to claim 4, wherein the lens device is only screwed to the internal thread separate from the housing.

9. The camera according to claim 4, wherein the lens device abuts on a mating abutment surface of a housing flange of the housing with an abutment surface, wherein the housing flange bounds a hole in the housing, through which the lens device extends into the interior of the housing.

10. The camera according to claim 9, wherein the abutment surface is pressed onto the mating abutment surface by the screw connection viewed in the direction of a longitudinal axis of the camera.

11. The camera according to claim 1, wherein the circuit board carrier comprises at least two contact pins, which are connected for electrical connection by each one solder joint and/or the circuit board carrier comprises a circumferentially closed stiffening web.

12. A method for assembling a camera with a housing, wherein said housing is formed of an electrically conductive material, the method comprising:
arranging at least one circuit board in the housing;
arranging an electrically conductive circuit board carrier of the camera in the housing,
wherein the circuit board carrier is separate to the housing and the circuit board, such, that the circuit board is carried by the circuit board carrier, wherein the circuit board carrier is formed plate-like and comprises an opening into which a lens device of the camera extends,
wherein a retaining ring separate to the housing is arranged in the opening and comprises an integrated internal thread;

screwing the internal thread of the retaining ring to an external thread of the lens device, electrically connecting the circuit board carrier with the circuit board; and electrically connecting the circuit board carrier with the housing.

\* \* \* \* \*